United States Patent
Peter et al.

(10) Patent No.: US 6,215,662 B1
(45) Date of Patent: Apr. 10, 2001

(54) CIRCUIT BOARD WITH INTERLEAVED TO-220 HEAT SINKS

(75) Inventors: Erik W. Peter, Hillsboro; Jeff J. Olsen, Banks, both of OR (US)

(73) Assignee: Intel Corporation, Hillsboro, OR (US)

( * ) Notice: Subject to any disclaimer, the term of this patent is extended or adjusted under 35 U.S.C. 154(b) by 0 days.

(21) Appl. No.: 09/524,163

(22) Filed: Mar. 13, 2000

(51) Int. Cl.⁷ ....................................... H05K 7/20
(52) U.S. Cl. .................... 361/704; 361/690; 361/695; 361/719; 174/16.1; 174/16.3; 165/80.3; 165/104.33; 165/185
(58) Field of Search .................. 361/688–690, 361/694, 695, 704, 707, 709, 718, 719; 174/15.1, 16.1, 16.3; 165/80.2, 80.3, 185, 104.33

(56) References Cited

U.S. PATENT DOCUMENTS

| | | | |
|---|---|---|---|
| 3,780,798 | * 12/1973 | Reimer | 165/128 |
| 3,955,122 | * 5/1976 | Maynard et al. | 361/710 |
| 5,530,295 | 6/1996 | Mehr | 257/796 |
| 5,535,094 | 7/1996 | Nelson et al. | 361/697 |
| 5,828,549 | * 10/1998 | Gandre et al. | 361/695 |
| 5,883,792 | 3/1999 | Thurston et al. | 364/704 |
| 5,894,882 | * 4/1999 | Kikuchi et al. | 165/80.3 |
| 5,898,219 | 4/1999 | Barrow | 257/713 |
| 5,912,802 | * 6/1999 | Nelson | 361/695 |
| 5,917,701 | * 6/1999 | Solberg | 361/704 |
| 5,917,702 | 6/1999 | Barrow | 361/704 |
| 5,935,209 | 9/1999 | Chiu | 361/697 |
| 5,946,188 | * 8/1999 | Rochel et al. | 361/690 |
| 5,990,552 | 11/1999 | Xie et al. | 257/718 |

OTHER PUBLICATIONS

"Discrete Semiconductor Products, DMOS Power MOSFET Databook," Jul. 1996 Edition, by National Semiconductor; Index p. (iii) p. 12–11.

"The Best Thermal Management Solutions from Around the World," Customer Letter, by Redpoint Thermalloy, Ltd., cover page, letter page, 6106B data page.

* cited by examiner

*Primary Examiner*—Leo P. Picard
*Assistant Examiner*—Boris L. Chervinsky
(74) *Attorney, Agent, or Firm*—Marger Johnson & McCollom, P.C.

(57) ABSTRACT

The invention provides a printed circuit board that has electronic power switches. The switches include vertical heat conductive metal backings, for attaching heat sinks. Each heat sink includes a main panel and two flanking fin panels. The main panels are attached to the metal backings and are arranged vertically, such as according to the TO-220 methodology. The invention provides bringing the power switches close to each other, and interleaving the fins according to various configurations, pairs or chain. Openings in the fin panels become aligned with each other, permitting a stream of air to move through them.

17 Claims, 2 Drawing Sheets

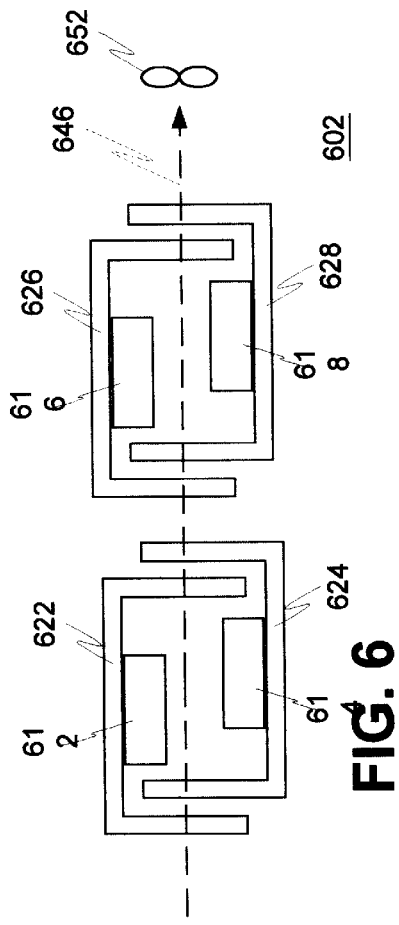
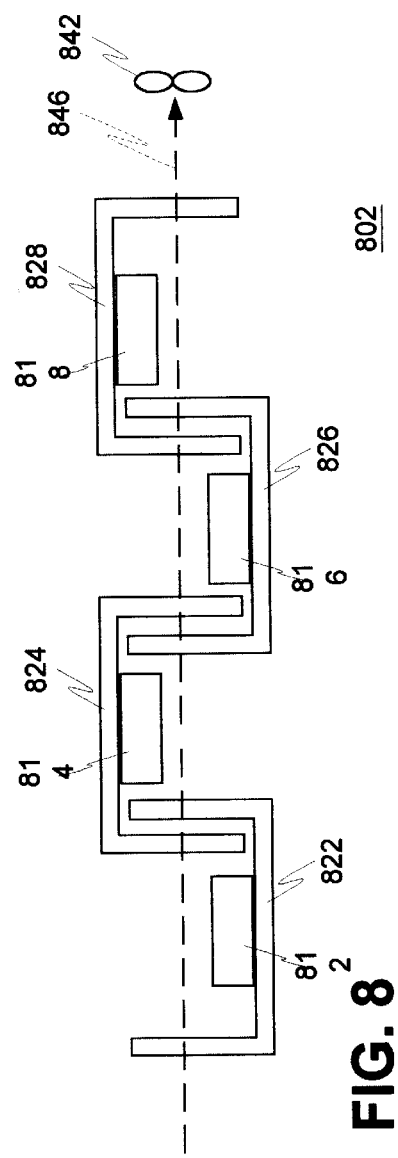
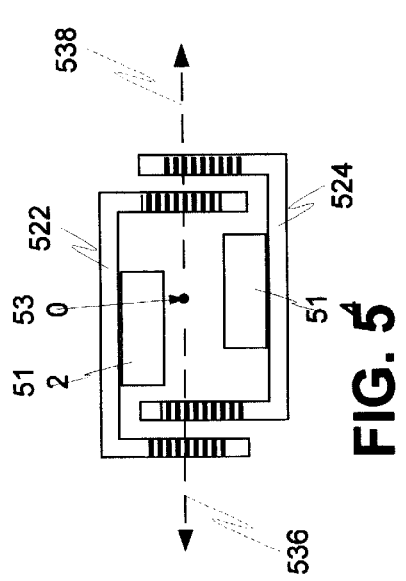
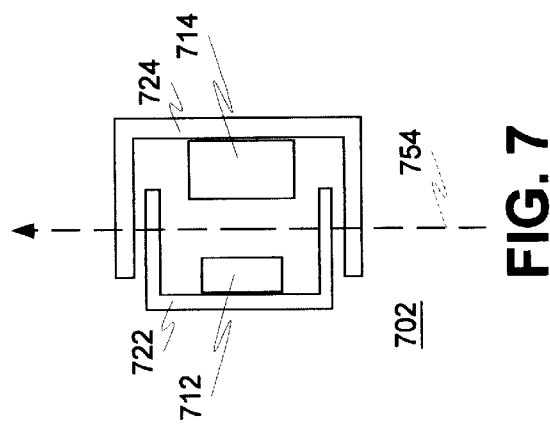

CIRCUIT BOARD WITH INTERLEAVED TO-220 HEAT SINKS

BACKGROUND

1. Field of the Invention

The present invention is related to the field of heat sinks, and more specifically to a novel arrangement of electric power switches and heat sinks on a printed electric circuit board.

2. Description of the Related Art

Complex electric circuits, such as those of computer units, are often manufactured on generally flat printed circuit boards, which are also known as motherboards. These circuits receive electrical power, and switch it with electrical switches to the various units of the circuit. These switches, also known as power switches, generate heat commensurate with the switched electrical power. It is a common practice to deal with the generated heat by attaching a heat sink to every electrical switch. An example of this is presented below.

Referring to FIG. 1, an electrical switch 50 is now described. The electrical switch 50 includes an electronic component 52, and that is typically encapsulated in electrically insulating material. The electronic component 52 is accessed by three electrical leads 54, 56, 58, which are typically received in holes of the printed circuit board (not shown). The electronic component 52 can be a transistor, an FET, a MOSFET, etc.

When an electrical switch, such as electrical switch 50, is intended for handling large amounts of electrical power, it is often provided with a heat conductive backing. The backing is typically made out of metal, for dissipating the heat generated by the electronic component 52.

Typically, the heat metal backing is provided in the form of tab 62 for the switch 50. In some methodologies, the tab 62 is soldered on the printed circuit board itself.

In a certain methodology, also known as TO-220 methodology, the tab 62 is intended to be arranged upright, perpendicularly to a plane of the printed circuit board, and parallel to the leads 54, 56, 58. The tab 62 includes a hole 64, for passing a screw (not shown). The screw is used to attach a heat sink to the switch 50.

Referring now to FIG. 2, a heat sink 70 is described. The heat sink 70 includes a main panel 72, which includes a hole 74. The hole 74 is for receiving a screw (not shown), for attachment to the switch 50 of FIG. 1. The heat sink 70 also includes two side panels 76, which are also known as fin panels 76. Optionally and preferably, the fin panels 76 include slots 78, which are also known as cuts 78. The heat sink 70 is typically made out of metal, and is painted black for radiating the heat better. In addition, the paint advantageously also provides electrical isolation.

Referring now to FIG. 3, the general attaching arrangement is illustrated. The leads 54, 56, 58 (not shown, but obscured by the electronic component 52) of the device 50 are inserted into holes (not shown, but obscured by the electronic component 52) of the printed circuit board 80. The hole 64 of the tab 62 is aligned with the hole 74 of the main panel 72 of the heat sink 70.

The attaching arrangement also illustrates the weaknesses of this methodology. More particularly, the arrangement of FIG. 3 occupies a lot of space on the printed circuit board 80. In particular, while the switch 50 can be physically small, the heat sink 70 demands a lot of space. This forces locating other devices farther away from switch 50.

The problem is made worse by the fact that typically many electrical power switches, such as switch 50, are designed to be grouped together nearby, for sharing between them the electrical load. Each of them requires a heat sink, and therefore each requires a lot of space around it. Accordingly, the bank of electrical switches occupies a large area of the motherboard.

There's also another reason on why that area cannot be made smaller. Devices having heat sinks are often cooled by use of fan, which establishes an airflow. But it has proven harder to establish an air flow when the heat sinks and the switches are crowded close to each other.

These problems have been addressed in the past by keeping the switches close to each other, and directing their fins away from the group. Another way has been by making each of the heat sinks smaller. This means making the side panels 76 less wide. This also means making the main panel 72 less wide, which brings this side panels 76 closer to the device 50.

But the rating of the heat sink 70 is determined by its dimensions. As the dimensions are getting smaller, to accommodate overcrowding on the board 80, the heat sink 70 can dissipate less heat. This is exactly contrary to the present needs of the industry. As electrical devices increase in capability, they consume more power, which in turn requires higher heat sinking capability. In addition, making the circuit boards larger runs the risk of exceeding standard sizes and form factors, which can adversely affect the acceptance and success of the product in the market.

BRIEF DESCRIPTION OF THE DRAWINGS

FIG. 5 is a diagram illustrating arranging electrical switches and heat sinks on a circuit board according to a pairing arrangement of the invention, with a first airflow scheme.

FIG. 6 is a diagram illustrating arranging multiple pairs of electrical switches and heat sinks on a circuit board according to the pairing arrangement of the invention, with a second airflow scheme.

FIG. 7 is a diagram illustrating arranging a pair of non identical electrical switches and heat sinks on a circuit board according to the pairing arrangement of the invention.

FIG. 8 is a diagram illustrating arranging electrical switches and heat sinks on a circuit board according to a chain arrangement of the invention.

DETAILED DESCRIPTION

The present invention provides assemblies of electrical switches and heat sinks on printed circuit boards. The invention calls for using large heat sinks in a topology similar to the TO-220 topology, while simultaneously interleaving the fin panels of the heat sinks. In other words, the fin panel of one of the heat sinks is placed between the fin panels of an associated neighboring heat sink. Preferably replacement of the heat sinks is such that the slots of the fin panels of neighboring heat sinks are aligned, to permit streamlined airflow.

The invention offers the advantage that larger heat sinks can be used, which affords a higher heating sinking capability, which in turn permits the electrical switches to handle more electrical power. This is accomplished without consuming more circuit board area, which prevents having to exceed a standard motherboard size or a standard form factor.

Another advantage of the invention is that the topology of the invention permits efficient cooling by airflow. Indeed, the slots of the side panels become aligned with each other. This permits air to flow through all of them in series, according to an airflow scheme.

Figure 4:
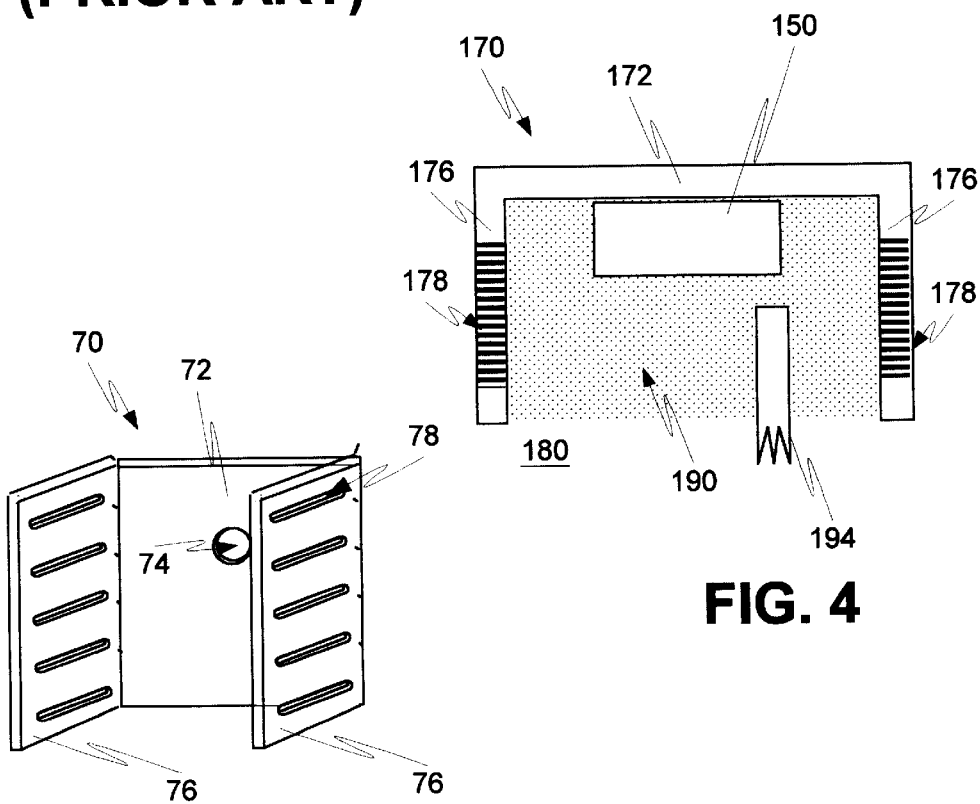
FIG. 4 is a diagram of a top view of an electric switch having a large heat sink that defines a large space between the fins, and further includes additional heat sink structure of another heat sink within the same space according to the present invention.

Referring now to FIG. 4, the heat generating electrical device 150 is provided with a heat sink 170. The heat sink 170 includes a main panel 172 and side panels 176 (also known as fin panels) that include slots 178. The main panel 172 is attached to the heat conductive metal backing of the device 150 (the metal backing is not shown separately).

The device 150 and the heat sink 170 are provided on a printed circuit board 180. Since this is a top view, the generally flat electrical printed circuit board 180 has a plane parallel to the plane of the paper. The main panel 172 is arranged substantially perpendicularly to the plane of board 180, such as according to the TO-220 methodology.

For the embodiment of FIG. 4, and for all the other descriptions of this invention, it is understood that the fin panel need not terminate in a smooth edge. If it does, the panel can have slots. Alternately, it can terminate in teeth. Whether they terminate in slots or in teeth, the fin panels 176 are said to have openings 178.

In addition, it is not necessary that an edge of the fin panel 176 be attached to the main panel 172 from an edge. In other words, the fin panel 176 can extend past a main plane of the main panel 172. In those cases the switch 150 will always be between the fin panels of its own heat sink.

Figure 1:
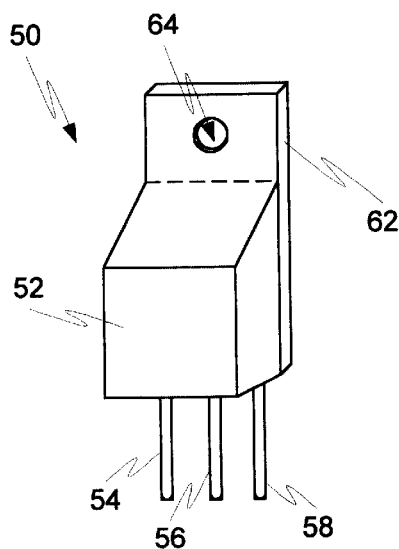
FIG. 1 is a perspective diagram of a prior art electric power switch, having a tab for receiving a heat sink according to a known methodology.
Figure 3:
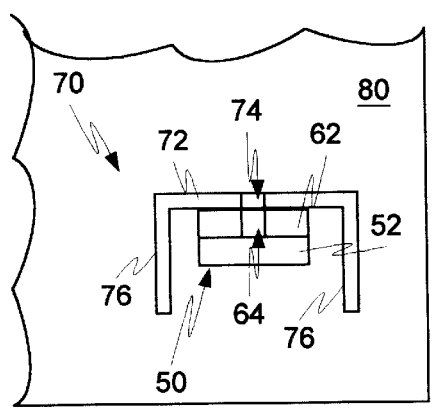
FIG. 3 is a diagram of a top view of the switch of FIG. 1, having received the heat sink of FIG. 2.
Figure 2:
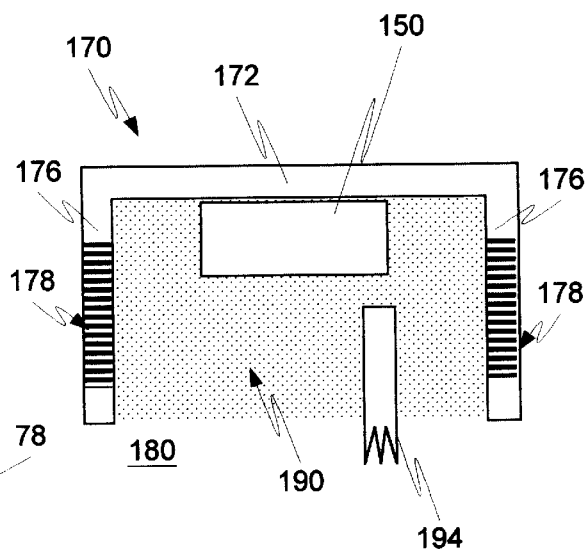
FIG. 2 is a perspective diagram of a prior art heat sink for use with the switch of FIG. 1.

It should be noted that the fin panels 176 are wider than the corresponding fin panels 76 of the FIG. 3. It should be further noted that the back panel 172 is wider than panel 72 of FIG. 3. This means that the fin panels 176 are farther away from device 150 then the corresponding ones in FIG. 3.

For purposes of understanding this invention, an interstitial space 190 is defined for the heat sink 170. The interstitial space 190 is the space between the fin panels 176. It should be noted that, since the main panel 172 and the fin panels 176 are larger than the corresponding ones of FIG. 3, the corresponding interstitial space 190 of the arrangement of FIG. 4 is substantially larger than that of FIG. 3. This is exactly against what the prior art teaches, for saving space on the printed circuit board 180.

Further according to the present invention, the heat sink 170 is interleaved with a neighboring heat sink. This means that at least one portion 194 of a neighboring heat sink of an associated electrical device is located between the fin panels 176. In other words, at least one portion 194 of a neighboring heat sink is located within the interstitial space 190.

This interleaving can be accomplished with a number of different arrangements. Two main arrangements are described below, the pairing arrangement in FIGS. 5, 6 and 7, and the chain arrangement in FIG. 8.

Referring now to FIG. 5, a pair of switches and heat sinks is described. The pair includes two electric switches 512, 514 that have heat sinks 522, 524, respectively attached to them. The two heat sinks 522, 524 are identical to each other, although that is not necessary. Each heat sink 522, 524 is identical to heat sink 170 of FIG. 4, although again that is not necessary. In the arrangement of FIG. 5, at least one of the fin panels of heat sink 522 is between the fin panels of heat sink 524. In addition, the heat sinks 522, 524 are so close together that at least a portion of device 512 is between the fin panels of heat sink 524. The converse is also true.

A benefit of the arrangement of the invention is that the fin panels of the heat sinks 522, 524 are close to each other, and their openings can be aligned. The benefit of the invention will be appreciated more if the system is designed such that cooling is performed with airflow.

According to another embodiment, the invention further includes a guide (not shown) to duct air from the top, to a point 530. The point 530 is located between the main panel of the first heat sink, the main panel of the second heat sink, and the four fin panels. Once air is ducted to point 530 it is then pushed through the aligned openings in the four fin panels, according to the main directions 536, 538. The air can be made to come from the top either by placing the fan on the top, or by placing a fan on the side, and ducting the air from the top.

Referring now to FIG. 6, it can be seen how the pair of FIG. 5 can be used as a building block. The pairs are arranged successively on a printed circuit board 602. More particularly, switches 612, 614, 616, and 618 are attached to heat sinks 622, 624, 626, and 628, respectively.

A feature of the arrangement of FIG. 6 is that the successive pairs form a duct for the airflow. Indeed, while the main panels of each heat sink 622, 624, 626, 628 form a duct, the openings in their fin panels permit air to flow through along the line 646. The airflow can be drawn by a fan 652. Alternately and equivalently, it can be forced by a fan.

Referring now to FIG. 7, a pair can be built differently on a printed circuit board 702. In particular, a small switch 712 and a large switch 714 have respectively attached to them a small heat sink 722 and a large heat sink 724. Both heat sinks 722 and 724 are arranged with their main panels substantially perpendicular to a plane of the board 702. In this case, the fin panels of heat sink 722 are located between the fin panels of heat sink 724.

The arrangement of FIG. 7 is particularly useful where a pair of switches 712, 714 have dissimilar power switching requirements, and therefore need to dispose of dissimilar amount of heat. The arrangement of FIG. 7 can be cooled by moving air along axis 754, through the aligned openings of the fin panels. Air can be moved either according to the airflow scheme of FIG. 5 or of FIG. 6. The latter will have to be chosen if the arrangement of FIG. 7 is used as a building block of linear arrangement similar to that of FIG. 6.

Referring now to FIG. 8, the chain arrangement of the invention is described for a printed circuit board 802 having a main plane parallel to the drawing. Switches 812, 814, 816, and 818 have respectively attached to them heat sinks 822, 824, 826, and 828. A fan 842 can be put into place to draw (or force) air along an airflow line 846.

It would be appreciated that the chain arrangement of the invention consumes more space on the printed circuit board 802. However, it renders it easier to mount the heat sinks 822, 824, 826, 828 on the respective devices 812, 814, 816, 818.

It should be understood that the embodiments explained below are scalable to different sizes of switches, and also to different sizes and shapes of heat sinks. This way optimum solutions can be derived for each application, in view of the present document.

A person skilled in the art will be able to practice the present invention in view of the present description, where numerous details have been set forth in order to provide a more thorough understanding of the invention. In other instances, well-known features have not been described in detail in order not to obscure unnecessarily the invention.

While the invention has been disclosed in some of its forms, the specific embodiments thereof as disclosed and illustrated herein are not to be considered in a limiting sense. Indeed, it should be readily apparent to those skilled in the art in view of the present description that the invention can be modified in numerous ways.

For a first example, different geometries are possible. As an option, in the embodiment of FIG. 8 the main panel of each heat sink could be made less wide, while the fin panels could be made wider. In addition, the fin panels of one device would not intrude fully within the space between the device and the fin panel of an associated neighboring heat sink device. In other words, the arrangement can be practiced with heat sinks having very wide side panels.

For a second example, in all of the embodiments of FIGS. 4–8, one or more of the electrical switches can be placed on the outside of its heat sink. In each case, the arrangement of the heat sinks relative to each other would be the same, while the device would be placed on the other side of the main panel of its heat sink. This may be desirable in some instances. For instance, in the embodiment of FIG. 6, the path for the airflow would be smoother if it were not constricted by the electrical devices. In addition, the path could be shaped tighter if the fin panels were less wide. In this case, the electrical switch may or may not be located within the fin panels of its own heat sink.

The inventor regards the subject matter of the invention to include all combinations and subcombinations of the various elements, features, functions and/or properties disclosed herein.

The following claims define certain combinations and subcombinations, which are regarded as novel and non-obvious. Additional claims for other combinations and sub-combinations of features, functions, elements and/or properties may be presented in this or a related document.

The invention claimed is:

1. An assembly comprising:
   a circuit board;
   first and second electrical switches coupled with the circuit board, each switch having a heat conductive backing member arranged substantially perpendicularly to a plane of the circuit board;
   a first heat sink including a main panel attached to the heat conductive backing member of the first switch, the first heat sink further including two fin panels attached at angles to a plane of the main panel;
   a second heat sink attached to the heat conductive backing member of the second electrical switch, wherein at least a portion of the second heat sink is located between the fin panels; and
   a fan to move air from openings in the first fin panel to openings in the portion of the second heat sink that is between the fin panels, and from the openings in the second heat sink to openings in the second fin panel.

2. The assembly of claim 1, wherein the first electrical switch is located between the fin panels.

3. The assembly of claim 1, wherein
   the second heat sink includes a main panel attached to the heat conductive backing member of the second switch,
   the second heat sink further includes two fin panels attached at angles to a plane of the main panel, and
   at least a portion of the first heat sink is located between the fin panels of the second heat sink.

4. The assembly of claim 3, wherein the first electrical switch is located between the fin panels of the first heat sink.

5. The assembly of claim 1, further comprising:
   a third electrical switch coupled with the circuit board and having a heat conductive backing member arranged substantially perpendicularly to the plane of the circuit board; and
   a third heat sink attached to the heat conductive backing member of the third electrical switch,
   wherein at least a portion of the third heat sink is located between the fin panels.

6. The assembly of claim 5, wherein the first electrical switch is located between the fin panels.

7. The assembly of claim 5, wherein the third heat sink includes a main panel attached to the heat conductive backing member of the third switch, the third heat sink further includes two fin panels attached at angles to a plane of the main panel of the third heat sink, the assembly further comprising:
   a fourth electrical switch coupled with the circuit board and having a heat conductive backing member arranged substantially perpendicularly to the plane of the circuit board; and
   a fourth heat sink attached to the heat conductive backing member of the fourth electrical switch,
   wherein at least a portion of the fourth heat sink is located between the two fin panels of the third heat sink.

8. An assembly comprising:
   an electrical circuit board;
   first and second electrical switches coupled with the circuit board, each switch having a heat conductive backing member arranged substantially perpendicularly to a plane of the circuit board;
   first and second heat sinks, each including a main panel attached to the heat conductive backing member of the first and second switches respectively, each heat sink further including two fin panels attached at angles to the main panel of the respective heat sink,
   wherein at least one of the fin panels of the first heat sink is located between the fin panels of the second heat sink, and
   wherein at least one of the fin panels of the second heat sink is located between the fin panels of the first heat sink; and
   a fan to move air around the panel of the first heat sink that is located between the fin panels of the second heat sink.

9. The assembly of claim 8, wherein at least a portion of the second electrical switch is located between the fin panels of the first switch.

10. The assembly of claim 8, wherein the first electrical switch is located between the fin panels of the first switch.

11. The assembly of claim 8, further comprising:
   a duct to duct air to a point between the main panel of the first heat sink, the main panel of the second heat sink and the four fin panels, and from the point through openings in the four fin panels.

12. The assembly of claim 11, wherein the first electrical switch is located between the fin panels.

13. An assembly comprising:

an electrical circuit board;

first and second electrical switches coupled with the circuit board, each switch having a heat conductive backing member arranged substantially perpendicularly to a plane of the circuit board;

first and second heat sinks, each including a main panel attached to the heat conductive backing member of the first and second switches respectively, each heat sink further including two fin panels attached at angles to the main panel of the respective heat sink, wherein the fin panels of the first heat sink are located between the fin panels of the second heat sink; and a fan to move air around the fin panels of the first heat sink.

14. The assembly of claim 13, wherein at least a portion of the second electrical switch is located between the fin panels of the first switch.

15. The assembly of claim 13, wherein the first electrical switch is located between the fin panels of the first switch.

16. The assembly of claim 13, further comprising:

a duct to duct air to a point between the main panel of the first heat sink, the main panel of the second heat sink and the four fin panels, and from the point through openings in the four fin panels.

17. The assembly of claim 16, wherein the first electrical switch is located between the fin panels.

* * * * *